(12) United States Patent
Schletterer

(10) Patent No.: US 7,369,332 B2
(45) Date of Patent: May 6, 2008

(54) CLOSING MODULE FOR AN OPTICAL ARRANGEMENT

(75) Inventor: Thomas Schletterer, Königsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 11/104,853

(22) Filed: Apr. 13, 2005

(65) Prior Publication Data
US 2005/0286146 A1    Dec. 29, 2005

(30) Foreign Application Priority Data
Apr. 13, 2004    (DE) .................... 10 2004 018 659

(51) Int. Cl.
*G02B 7/02* (2006.01)
(52) U.S. Cl. .................... 359/819; 359/811; 359/815
(58) Field of Classification Search ............... 359/819, 359/811, 815, 816, 818, 822, 823, 827
See application file for complete search history.

(56) References Cited

U.S. PATENT DOCUMENTS

| 6,318,912 | B1 * | 11/2001 | Shono et al. | ............... 396/342 |
| 6,400,516 | B1 * | 6/2002 | Spinali | ................ 359/819 |
| 6,509,956 | B2 * | 1/2003 | Kobayashi | ................ 355/55 |
| 6,867,923 | B2 * | 3/2005 | Singer et al. | ............... 359/667 |
| 2002/0027725 | A1 * | 3/2002 | Schletterer | .................. 359/811 |
| 2003/0076602 | A1 * | 4/2003 | Nishikawa | ................... 359/819 |
| 2003/0234989 | A1 * | 12/2003 | Oshino et al. | ............. 359/811 |
| 2004/0012861 | A1 * | 1/2004 | Yamaguchi | ................. 359/772 |

FOREIGN PATENT DOCUMENTS

| DE | 37 51 485 T2 | 2/1996 |
| DE | 100 30 005 A1 | 12/2001 |
| DE | 101 39 805 C1 | 10/2002 |
| DE | 101 40 608 A1 | 8/2003 |
| EP | 1 339 099 | 8/2003 |
| WO | WO 02/065183 | 8/2002 |

OTHER PUBLICATIONS

Inernational Preliminary Report on Patentability for PCT/EP2005/003875 dated Oct. 19, 2006.
Written Opinion of the International Searching Authority for PCT/EP2005/003875 dated Oct. 19, 2006.

* cited by examiner

*Primary Examiner*—Timothy Thompson
(74) *Attorney, Agent, or Firm*—Ohlandt, Greely, Ruggiero & Perle, L.L.P.

(57) ABSTRACT

Closing module for an optical arrangement, in particular for an objective for microlithography, comprising an optically active closing element (3) having a first axis (3.1) and a holding device (2) that fixes the closing element (3) at least in the direction of the first axis (3.1), the holding device (2) being configured for radial clamping of the closing element (3).

25 Claims, 5 Drawing Sheets

CLOSING MODULE FOR AN OPTICAL ARRANGEMENT

BACKGROUND OF THE INVENTION

The present invention relates to a closing module for an optical arrangement. The invention can be used in connection with the microlithography utilised in the manufacture of microelectronic circuits. It therefore also concerns a lens barrel which is suitable, in particular, for use in a microlithography device, and a microlithography device including such a lens barrel.

Lens barrels composed of a plurality of modules are used in a large number of optical applications, in particular in the field of microlithography mentioned above. The individual modules include, as a rule, one or more optical elements such as lenses, etc. The end of such a lens barrel in the direction of its optical axis is generally formed by a closing module having an appropriate optical closing element. Such a closing module may serve the purpose, among others, of sealing the interior of the lens barrel from the environment.

In particular in the field of microlithography it is necessary to position the optical elements used in the lens barrel, for example, the lenses, with the greatest possible spatial precision with respect to one another, in order to achieve appropriately high imaging quality. The high demands for accuracy are not least a result of the constant need to increase the resolution of the optical systems used in the manufacture of microelectronic circuits to drive forward the miniaturisation of the microelectronic circuits to be manufactured.

With increased resolution there are increasing demands not only for the positional accuracy of the optical elements used, but also for the accuracy of the optical elements themselves. The latter must be maintained as fully as possible in the installed state throughout operation. It is especially necessary to keep the optical element as free of stress as possible during operation to avoid imaging errors caused by deformation of the optical element. In addition, there is a need in this context to achieve the most favourable possible dynamic behaviour of the optical system used, with the highest possible resonant frequencies.

For the optical elements, i.e. the lenses, etc., inside the lens barrel a number of measures for achieving a mounting as stress-free as possible are known. For example, a comparatively complex and expensive mounting for such a lens inside the lens barrel is known from U.S. patent application Ser. No. 2002/1063741 A1. Patent DE 101 39 805 C1 and patent application EP 1 094 348 A2 also disclose variants for the mounting of lenses inside the lens barrel.

However, the above-mentioned closing elements present a problem in this context. They are in general mounted in a sealed manner in a corresponding mount, together with which they form the closing module. The closing elements, which are often plane-parallel plates, are often adhesively bonded to the mount. This type of fixing has the disadvantage, firstly, that it is not free of stress, so that deformations of the closing element which impair the imaging quality of the system can occur. Secondly—even with closing elements originally mounted in an almost stress-free manner—such undesired deformation can occur as a result of the unavoidable thermal expansion of the system in operation. Finally, subsequent adjustment of the closing element is, in particular, extremely difficult.

It is therefore the object of the present invention to make available a closing module of the type mentioned initially which does not have the above-mentioned disadvantages or at least has them to a lesser degree, and, in particular, makes possible a reliable mounting of the closing element which is precise and free of stress in operation.

BRIEF SUMMARY OF THE INVENTION

This object is achieved by the present invention with a closing module having the features of claim 1.

The present invention is based, firstly, on recognition of the fact that a reliable mounting of the closing element which is precise and free of stress in operation is obtained if the holding device for the closing element is configured to clamp the closing element radially. With radial clamping it is possible, in particular, to achieve a contact geometry between the closing element and the holding device which ensures extensive decoupling of deformations between the holding device and the closing element. Deformations of the holding device are therefore transmitted to the closing element, if at all, to only a minimised extent.

A further advantage of the radial clamping is simpler assembly and the possibility of adjusting the closing element at all times. Unlike the case with the known closing modules having a fixedly inserted closing element, it is thus possible to react to changed boundary conditions quickly and simply at all times.

In addition, it has been shown that, even with such a radially clamped connection, the undesired ingress of external media or foreign bodies, etc., into the interior of the lens barrel can be reliably and simply prevented.

The present invention is also based on recognition of the fact that a reliable mounting of the closing element that can subsequently be adjusted according to the requirements of the imaging system is obtained if the holding device is designed for tilting of the first axis of the closing element.

An object of the present invention is thus a closing module for an optical arrangement, in particular for an objective for microlithography, with an optically active closing element having a first axis, and a holding device fixing the closing element at least in the direction of the first axis. The holding device is in this case configured for radial clamping of the closing element.

A further object of the present invention is a closing module for an optical arrangement with an optically active closing element having a first axis, and a holding device fixing the closing element at least in the direction of the first axis, the holding element being configured for tilting of the first axis of the closing element.

A further object of the present invention is a closing element for a closing module according to the invention and a holding device for a closing module according to the invention.

A further object of the present invention is a lens barrel, in particular a lens barrel for a microlithography device, having a closing module according to the invention.

A further object of the present invention, finally, is a microlithography device for transferring a pattern formed on a mask onto a substrate, said device having an optical projection system that includes a lens barrel according to the invention.

Further preferred embodiments of the invention are apparent from the dependent claims and from the following description of a preferred embodiment made with reference to the appended drawings.

DETAILED DESCRIPTION OF THE INVENTION

With reference to FIGS. 1 to 5 a preferred embodiment of a closing module 1 according to the invention for an objective for microlithography is first described in the following.

Figure 1:
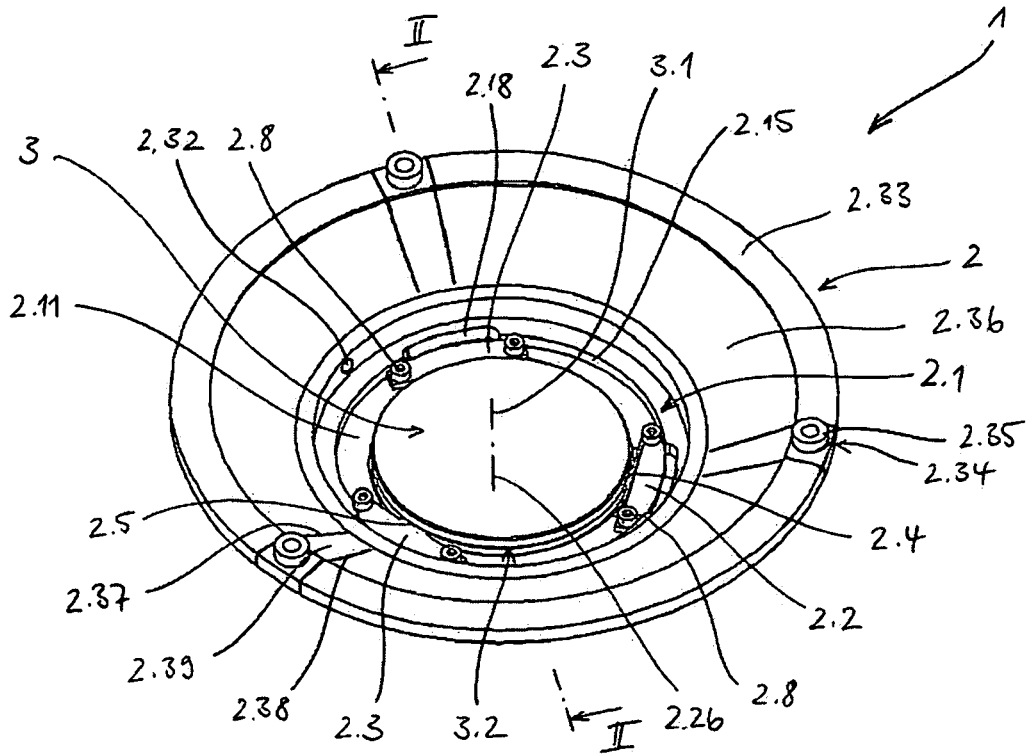
FIG. 1 is a schematic perspective representation of a preferred embodiment of the closing module according to the invention.

FIG. 1 is a schematic perspective representation of the closing module 1 having a holding device 2 according to the invention that holds a closing element 3 according to the invention in the form of a plane-parallel closing plate with a first axis 3.1. The first axis, in this case, is an axis of symmetry of the closing element 3 disposed perpendicularly on the centre plane of the closing element 3. The centre plane forms the principal plane of extension in which the flat closing element 3 primarily extends. In the case of closing elements configured in the manner of lenses the first axis corresponds, as a rule, to the optical axis of the lens-like closing element.

The holding device comprises an inner frame 2.1 to which three evenly distributed holding elements—a first holding element 2.2 and two second holding elements 2.3—are fixed. These holding elements 2.2 and 2.3, as second contact partners, are in each case in engagement in a contact pairing with the closing element 3 as the first contact partner. The holding elements 2.2 and 2.3, with respect to the closing element 3, each exert a clamping force on the closing element 3 that is directed radially towards the first axis 3.1. In other words, the closing element 3 is clamped radially by the holding elements 2.2 and 2.3.

It is self-evident that the clamping force is not necessarily the only force that is exerted by the particular holding element on the closing element. Rather, further forces acting in different directions may be exerted on the closing element by the respective holding element.

In the respective contact area between the holding elements 2.2 and 2.3, respectively, and the closing element 3 a projection 2.4 and 2.5, respectively, on the holding elements 2.2 and 2.3, respectively, engage as contact elements in a V-shaped groove 3.2 disposed around the circumference of the closing element 3. In this case the projection 2.4 and 2.5, respecively, on the holding elements 2.2 and 2.3, respectively, exert the clamping force directed radially towards the first axis on the closing element 3.

The groove 3.2, which has a rounded base, is formed symmetrically with respect to the centre plane 3.3 of the closing element 3 representing the neutral fibre of the closing element 3. Furthermore, the projections 2.4 and 2.5, respectively, on the respective holding element 2.2 and 2.3, respectively, are so configured and oriented that the resulting clamping force exerted in each case on the closing element 3 is disposed substantially in the centre plane 3.3 disposed perpendicularly to the first axis 3.1, and therefore in the neutral fibre.

A minimisation of the bending deformation of the closing element 3 by the clamping forces is thereby achieved, which has a positive effect on the imaging quality of an optical system equipped with a closing module 1 of this kind. It is self-evident that the clamping force concerned may deviate to a greater or lesser extent from the path of the neutral fibre. This is dependent substantially on the tilting of the first axis 3.1 with respect to the geometrical axis of the holding device 2. As explained in more detail below, this tilting can be varied with the present closing module 1.

The V-shaped groove 3.2 has, in a section containing the first axis, rectilinear flanks 3.4 and 3.5. Only at the base is it rounded, as mentioned. In such a section the respective projection 2.4 and 2.5 has an upper and lower radius of curvature 2.6 and 2.7, respectively. The distance between the flanks 3.4 and 3.5 in the direction of the first axis 3.1 and the distance between the radii of curvature 2.6 and 2.7 in this direction are so adapted to one another that the projection 2.4 and 2.5, respectively, contact the flanks 3.4 and 3.5 in their rectilinear portion.

In a section perpendicular to the first axis the V-shaped groove 3.2 has a smaller radius of curvature than the associated projection 2.4 and 2.5, respectively, in the same section. Two substantially point shaped contact sites between the projections 2.4 and 2.5, respectively, and the flanks 3.4 and 3.5 of the groove 3.2 are thereby achieved. In the sense of the present invention, the phrase "substantially point shaped contact site" should be understood to mean that, with ideally stiff contact partners having ideal geometry, a point shaped contact would be produced. In reality, of course, depending on the stiffness of the contact partners and their deviation from the ideal geometry, a small point-like contact area is produced.

However, it is self-evident that with other variants of the present invention other geometries of the contact sites can be provided. For example, linear and area shaped contact sites may also be provided.

Through the contact pairing with two substantially pont shaped contact sites per holding element 2.2 and 2.3, respectively, a self-adjusting clamping pairing is produced. Differences of level between the holding elements 2.2 and 2.3, for example, can thereby already be compensated within the contact area between the holding element 2.2 and 2.3, respectively, and the closing element 3, without significant stresses being introduced into the closing element 3. High imaging quality can thereby be achieved without complex and expensive mounting of the holding elements 2.2 and 2.3, respectively.

The holding elements 2.2 and 2.3, respectively, hold the closing element 3 both in a positive connection and in a frictional connection in the direction of its first axis 3.1 and in the radial direction. In addition, they also hold the closing element 3 in a frictional connection in its circumferential direction. This brings with it the advantage that, by overcoming the friction, the closing element 3 can be simply rotated about its first axis 3.1, so that eventually, imaging errors (form errors) of the optical system can be at least partially compensated.

In the present example a definitely determined mounting of the closing element 3 with defined radial clamping forces is achieved by means of a configuration comprising two fixed mounts and one resilient mount. The first holding element 2.2 forms the resilient mount while the two second holding elements 2.3 each represent a fixed mount.

Figure 4:
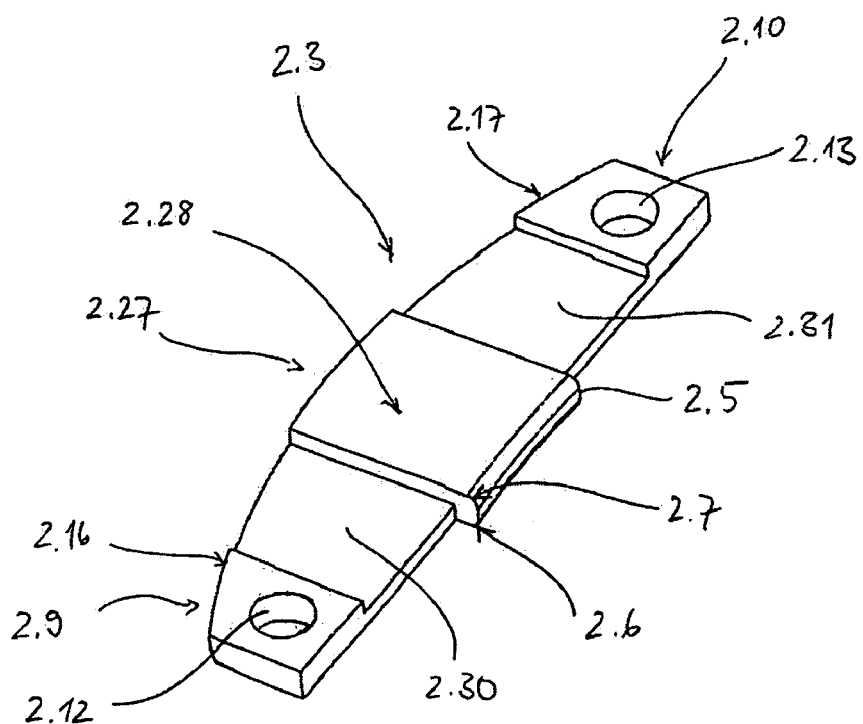
FIG. 4 is a schematic perspective representation of a second holding device from FIG. 1.

The plate-like second holding element 2.3, shown from its underside in FIG. 4, is fixed at each end 2.9 and 2.10 by means of screws 2.8 to an annular step 2.11 of the inner frame 2.1. The screws 2.8 pass with radial clearance through bores 2.12 and 2.13 in the second holding element 2.3.

The exact radial positioning of the second holding element 2.3 is ensured by stops 2.14 on an annular shoulder 2.15 of the inner frame 2.1. During assembly the second holding element 2.3 is pushed radially against the stops 2.14 before tightening of the screws 2.8, so that its rear lateral faces 2.16 and 2.17 rest in each case against a stop 2.14. Recesses 2.18 in the shoulder 2.15 ensure that the holding element 2.3 rests against the shoulder 2.15 only in the region of its ends 2.9 and 2.10.

Since the plane of the second holding element 2.3, in the assembled state, is aligned substantially perpendicularly to the first axis 3.1 and substantially parallel to the clamping force exerted on the closing element 3, in the assembled state, the second holding element 2.3 forms in the radial direction a substantially rigid fixed mount for the closing element 3.

Figure 3:
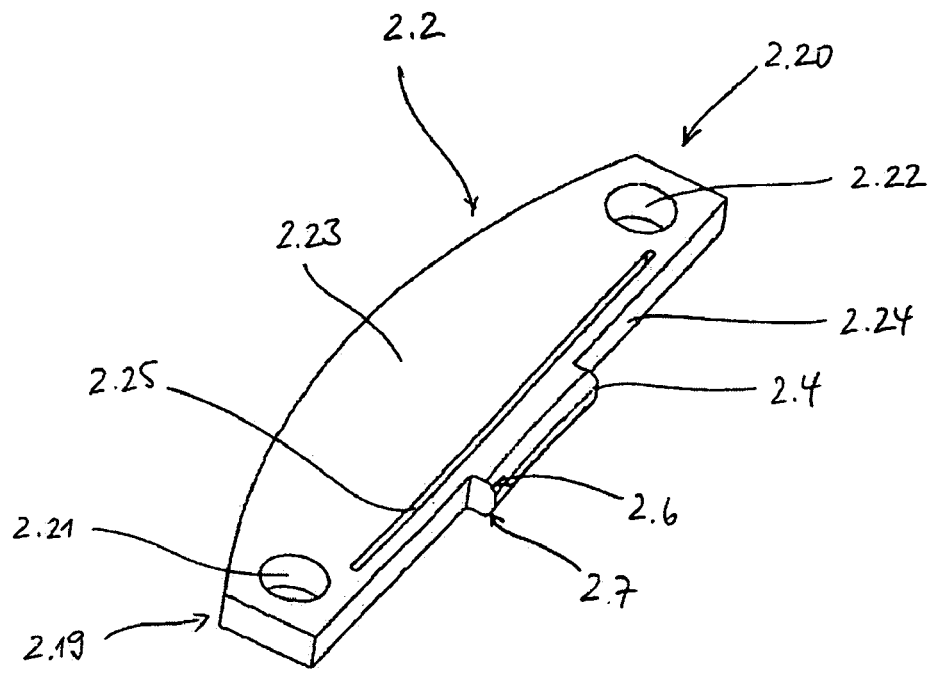
FIG. 3 is a schematic perspective representation of the first holding device from FIG. 1.

The first holding element 2.2, as a radially resilient mount is located opposite the two radial fixed mounts formed by the second holding elements 2.3. The plate-like first holding element 2.2 shown in FIG. 3 is also fixed at both ends 2.19 and 2.20 by means of screws 2.8 to the annular step 2.11 of the inner frame 2.1. Here, too, the screws 2.8 pass with radial clearance through bores 2.21 and 2.22 in the first holding element 2.2.

To achieve the radially resilient effect the first projection 2.4 of the first holding element 2.2 is arranged resiliently on a first holding body 2.23. The first projection 2.4 can be deflected resiliently in a direction which is at least approximately perpendicular to the first axis 3.1. In the direction of the first axis 3.1 the first holding element 2.3 is arranged substantially rigidly on the first holding body 2.23. This is achieved by the central arrangement of the first projection 2.4 on a flexible beam 2.24 held at both ends. This flexible beam 2.24 is in turn formed by means of an elongated slot 2.25 in the first holding body 2.23 penetrating in the direction of the first axis 3.1.

During assembly, which takes place after assembly of the second holding elements 2.3, the first holding element 2.2—as a result of the radial clearance of the screws 2.8 in the bores 2.21 and 2.22—is displaced radially against the closing element 3 until it rests against the closing element 3 with a defined radial pretension, i.e. with a defined radial clamping force. The pretension may be verified, for example, with a suitable gauge or the like. In this position the screws 2.8 are then tightened. The first holding element 2.2 thereby does not rest against the shoulder 2.5 of the inner frame 2.1.

Because of the resilient configuration of the first holding element 2.2, this pretension remains substantially constant even with thermal expansion of the components in operation. In other words, through this configuration, a decoupling of thermal deformations is achieved. A further advantage of this configuration lies in the compensation of manufacturing tolerances that is thereby achieved.

It is self-evident that, with other variants of the closing module according to the invention, it may also be provided that more than one holding element is configured resiliently in this way. In particular, all the holding elements may be configured resiliently in this way. It is also self-evident that the radially resilient configuration can be achieved in any other way. For example, the projection forming the contact element with the closing element may, for example, be arranged on a flexible beam which is held at one end instead of the flexible beam held at both ends.

As is explained below, in particular with reference to FIGS. 2 and 4, the tilt of the first axis 3.1 of the closing element 3 with respect to the geometrical axis 2.26 of the holding device 2 can be adjusted via the two second holding elements 2.3. The geometrical axis 2.26 coincides with the first axis 3.1 in the state represented in FIG. 1.

To be able to adjust the tilt of the first axis 3.1 of the closing element 3 with respect to the geometrical axis 2.26 of the holding device 2, the inner frame 2.1 and the respective second holding element 2.3 are configured and arranged such that, in the assembled state, the second holding element 2.3 also represents a flexible beam held at both ends, the central portion 2.27 of the latter being freely deflectable in the direction of the first axis 3.1 or of the geometrical axis 2.26, respectively.

Also arranged in this central portion 2.27 is the projection 2.5 contacting the closing element 3, i.e. the contact element with the closing element 3. Consequently, a deflection of the central portion 2.27 in the direction of the first axis 3.1 or of the geometrical axis 2.26, respectively, is transmitted to the closing element 3. Through the deflection of the two projections 2.5 of the second holding elements 2.3 spaced apart in the circumferential direction, therefore, it is possible—within certain limits—to adjust the tilt of the first axis 3.1 with respect to the geometrical axis 2.26 as desired. As this happens, the above-described contact geometry with two substantially point shaped contact sites per contact pairing also ensures that, at most, comparatively small stresses are induced in the closing element 3.

To deflect the central portion 2.27 in the direction of the first axis 3.1 or of the geometrical axis 2.26, respectively, a positioning element 2.29 arranged in the region of the projection 2.11 on the inner frame 2.1 cooperates with a contact face 2.28 in the central portion 2.27 of the second holding element 2.3. In the present case, the positioning element 2.29 is a passive positioning element in the form of an adjusting screw 2.29 which is screwed into the inner frame 2.1. It is self-evident, however, that, in other variants of the invention, active positioning elements such as piezo actuators, etc., may also be provided. With such active positioning elements a regular and optionally even continuous adjustment of the tilting can be achieved by means of a suitable control system.

To make possible or facilitate, respectively, the defined deflection of the central portion 2.27, the respective second holding element 2.3 has between its end portions 2.9 and 2.10 and the central portion 2.27 two flexible portions 2.30 and 2.31 having a cross-section reduced in a defined manner. When the central portion 2.27 is deflected in the direction of the first axis 3.1 or of the geometrical axis 2.26, respectively, the flexible portions 2.30 and 2.31 then undergo a defined deformation.

Through the above-described configuration with the two axially adjustable fixed mounts in the form of the second holding elements 2.3 and the non-axially adjustable, resilient mount in the form of the first holding element 2.2, tilting of the first axis 3.1 can be adjusted, as mentioned. It is, however, self-evident that, with other variants of the present invention, complete axial adjustment of the closing element 3 in the direction of its first axis can be provided. In other words, all the holding elements may be configured to be axially deflectable in a corresponding manner.

Figure 2:
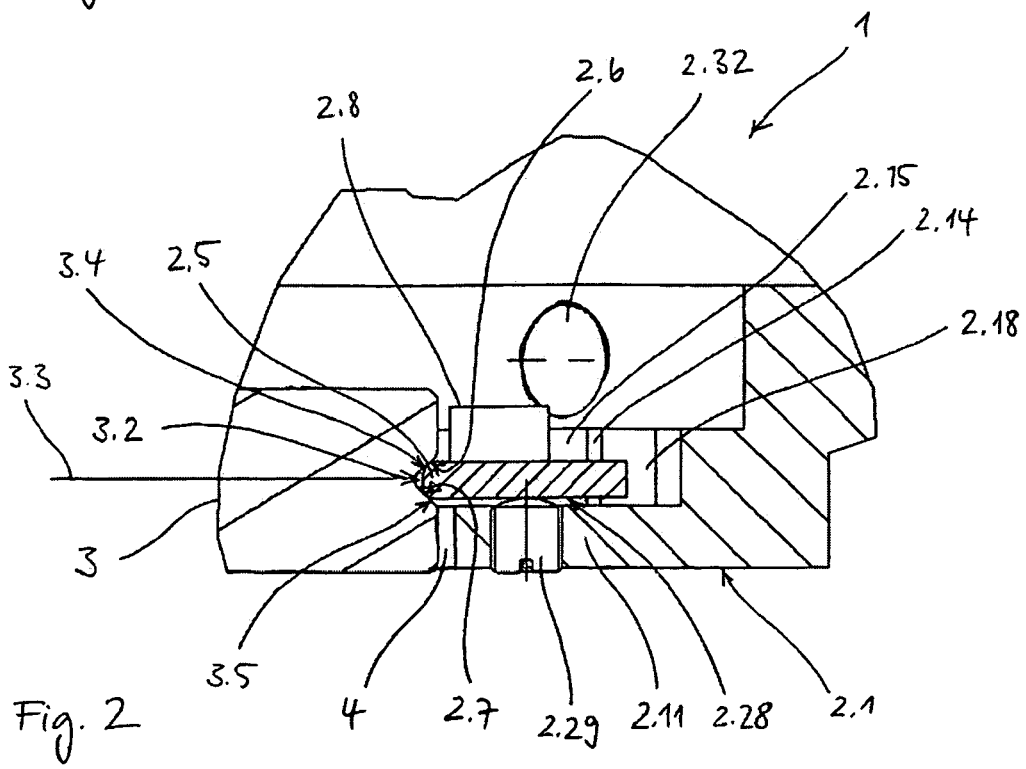
FIG. 2 is a schematic partial section through the closing module from FIG. 1 along the line II-II.

As can be seen, in particular, in FIG. 2, an annular gap 4 having a substantially constant radial dimension in the circumferential direction is formed between the inner frame 2.1 and the closing element 3. To prevent ingress of external media or foreign bodies through this gap 4 into the interior of an optical arrangement having the closing module 1, the holding device 2 includes a purging passage 2.32. A purging medium can be conducted into the interior of the closing module 1 via this purging passage 2.32. The purging medium then escapes from the interior of the closing module 1 via the gap 4, thus preventing the ingress of undesired substances into the interior of the optical arrangement via the gap 4.

The gap 4 may have comparatively small dimensions so that even small volume flows of the purging medium suffice to produce this effect. In particular with so-called immersion applications in which the optical arrangement is immersed in a liquid, i.e. the closing element is surrounded on its outer side by a liquid medium, the building up and maintaining of a suitable static pressure can suffice to produce this effect. A continuous escape of the purging medium through the gap 4 is not essential in this case.

As can be seen, in particular, in FIG. 1, the holding device 2 also has an annular outer flange 2.33 spaced radially from the inner frame 2.1. This outer flange 2.33 serves as a connection to the adjacent components of an optical arrangement to which the closing module 1 is attached. For this purpose the outer flange 2.33 has three connecting areas 2.34 with through-bores for fixing screws or the like distributed evenly around its circumference. In addition, spacers 2.35, by means of which the axial distance from the adjacent components can be adjusted, may be provided in the region of the through-bores. Because of suitable clearance of the fixing screws in the through-bores, the whole closing module 1 can be adjusted with respect to the adjacent components transversely to the first axis 3.1.

The inner frame 2.1 is connected to the outer flange 2.33 via a circumferential wall 2.36 in the form of an envelope of a cone. Before and after each connecting area 2.34 in the circumferential direction, radial slots 2.37 and 2.38 extend through the outer flange 2.33 into the wall 2.36. The radial slots 2.37 and 2.38 are continuous in the direction of the first axis so that tabs 2.39 resilient in the direction of the first axis are formed. The resilient tabs 2.39 ensure decoupling of thermal deformations between the closing module and the adjacent components. They extend so far in the direction of the inner frame that a given predefined minimal stiffness of the holding device 2 is still retained.

In the present example the material of the components of the holding device 2 is adapted with respect to its coefficient of thermal expansion to the material of the closing element 3. In other words, the components of the holding device 2 are made of a material which has the same coefficient of thermal expansion as the closing element 3. For example, if the closing element 3 is made of quartz, the components of the holding device 2 are made of invar, Zerodur or ceramic materials. If the closing element 3 is made of calcium fluoride, the components of the holding device 2 are preferably made of a suitable special steel.

As a result, thermally-induced differential expansion does not occur. The radial spring effect of the first holding element 2.2 serves only to generate the clamping force, which is substantially invariable in operation. The clamping force exerted on the closing element 3 can therefore be restricted within close limits to the required amount throughout operation. This has a positive effect on deformation of the closing element 3. The closing element 3 is then retained to the greatest possible extent in a positive manner in all spatial directions.

However, it is self-evident that, in other variants of the invention, only a partial adaptation of individual components of the holding device with respect to the coefficient of thermal expansion may be provided, eventually.

Figure 5:
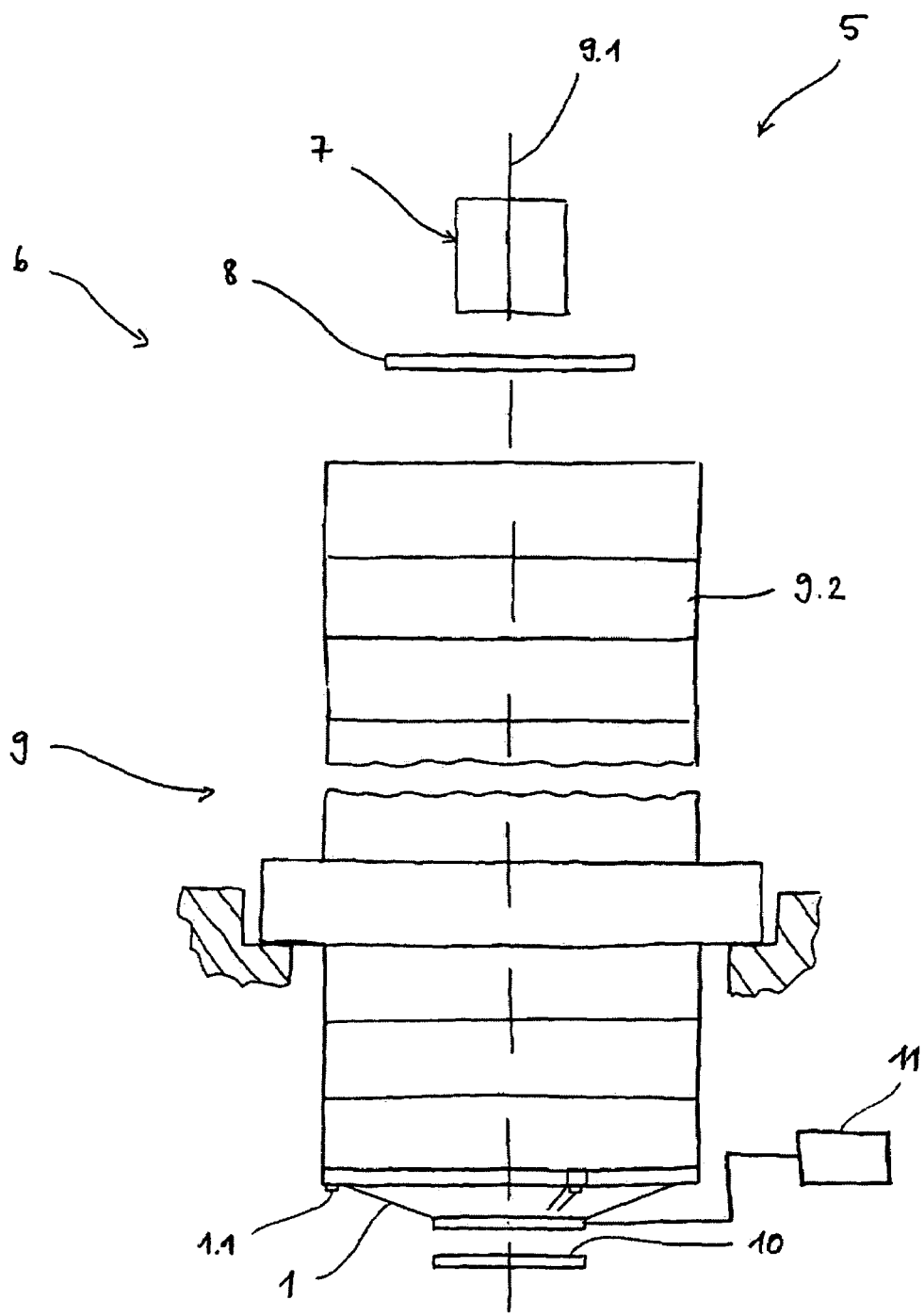
FIG. 5 is a schematic representation of a preferred embodiment of the microlithography device according to the invention with a lens barrel according to the invention.

FIG. 5 is a schematic representation of a preferred embodiment of the microlithography device 5 according to the invention. The microlithography device 5 includes an optical projection system 6 with an illumination system 7, a mask 8 and a lens barrel 9 with an optical objective axis 9.1. The illumination system 7 illuminates a mask 8. Located on the mask 8 is a pattern which is projected via the lens barrel 9 onto a substrate 10, for example, a wafer.

The lens barrel 9 includes a series of optical modules 9.2 having optical elements such as lenses or the like. At its end facing towards the substrate the lens barrel 9 is closed by the closing module 1 of FIG. 1. The closing module 1 is connected to a purging device 11 which conducts a purging medium into the interior of the closing module 1 via the purging passage 2.32.

Figure 6:
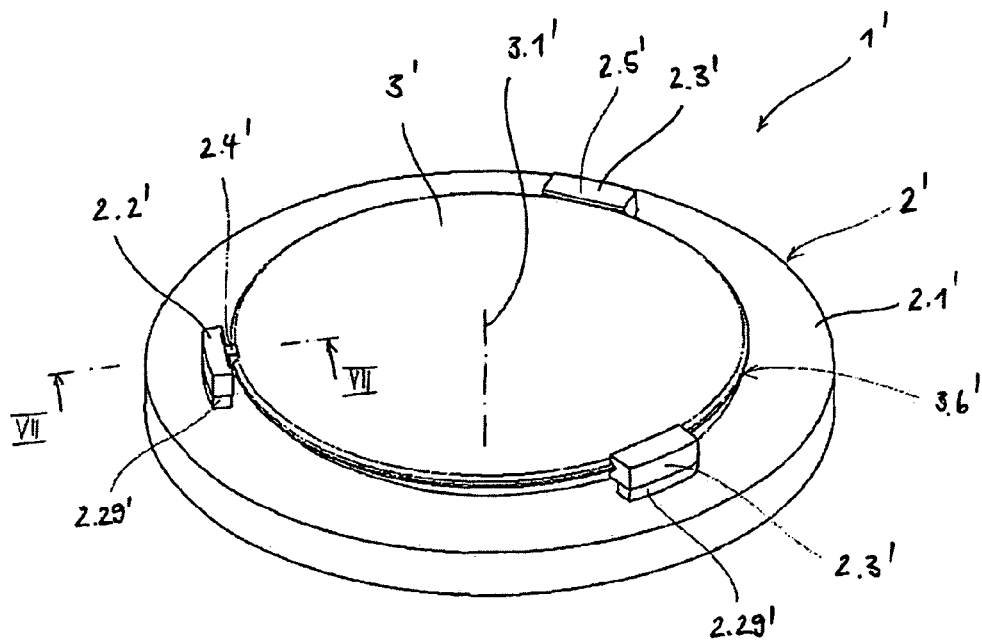
FIG. 6 is a schematic perspective representation of a further preferred embodiment of the closing module according to the invention.
Figure 7:
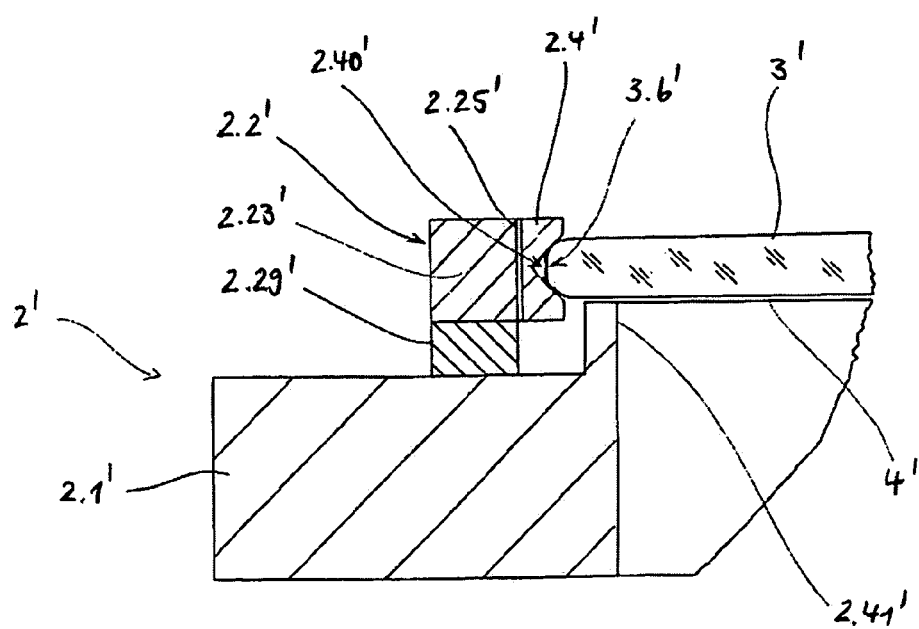
FIG. 7 is a schematic partial section through the closing module from FIG. 6 along the line VII-VII.

FIGS. 6 and 7 show schematic representations of a further preferred embodiment of the closing module 1' according to the invention. This embodiment, in its basic construction, does not differ from that of FIGS. 1 and 4 so that only the differences are discussed primarily here.

The difference from the embodiment of FIGS. 1 to 4 lies in the reversal of the contact geometry between the holding elements 2.2' and 2.3' of the holding device 2' and the closing element 3'. Thus, in this case a contact element 2.4' and 2.5', respectively, having a V-shaped groove 2.40' on the respective holding element 2.2' and 2.3' forms the contact partner with the circumferential edge of the plane-parallel closing element 3', which engages in each case in the groove 2.40'.

Here, too, however, it is ensured by appropriate adaptation of the radii of curvature of the contact partners that two substantially point shaped contact sites with the above described advantages of low stress in the mounting are present between the respective holding element 2.2' and 2.3' and the closing element 3' in the region of each contact pairing.

Furthermore, through a configuration having the first holding element 2.2' as the radially resilient mount and two second holding elements 2.3' as the fixed mounts, the above-described definitely determined mounting of the closing element 3' is ensured here also. As in the embodiment of FIGS. 1 to 4, the radially resilient configuration of the first holding element 2.2' is realised by the arrangement of the contact element 2.4' on a flexible beam that flexes perpendicularly to the first axis 3.1' and is held at both ends. This flexible beam is again formed by means of a slot 2.25' in the holding body 2.23' penetrating in the direction of the first axis 3.1'.

A further difference from the embodiment of FIGS. 1 to 4 is that all the holding elements 2.2' and 2.3' are fixed to the inner frame 2.1' of the holding device 2' via an active positioning element 2.29'. The active positioning element 2.29' displaces the respective holding element 2.2', 2.3' in the direction of the first axis 3.1'. By means of these positioning elements 2.29', therefore, not only the tilting of the first axis 3.1', but also the axial distance of the closing element 3' from an adjacent optical component, can be adjusted. The dimension of the circumferential gap 4' which is formed between the closing element 3' and the annular step 2.41' on the inner frame 2.1' can also be adjusted thereby.

FIGS. 8A to 8H are schematic partial sections through further preferred embodiments of the closing module according to the invention. They show by means of schematic partial sections different possible forms for the contact pairing between the closing element 3" and the respective holding element 2.2".

Figure 8A:
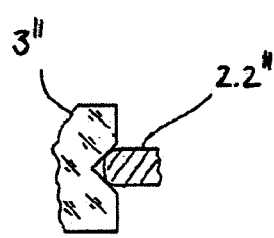
FIGS. 8A to 8H are schematic partial sections through further preferred embodiments of the closing module according to the invention.
Figure 8B:
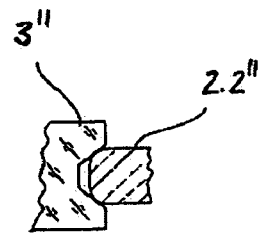
Figure 8C:
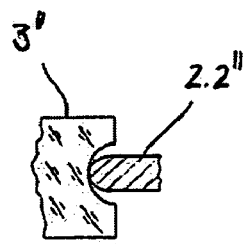
Figure 8D:
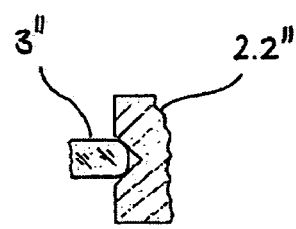
Figure 8E:
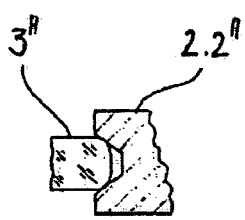
Figure 8F:
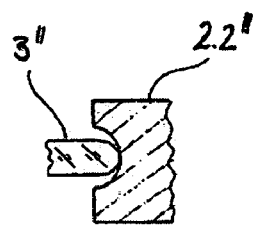
Figure 8G:
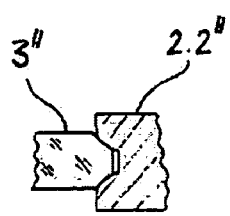
Figure 8H:
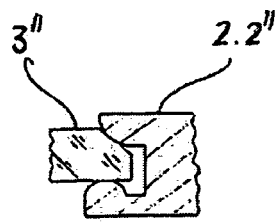

The contact pairings of FIGS. 8A to 8C are similar to the contact pairing that can be used with the closing element 3 of FIGS. 1 to 4. These contact pairings having a groove in the closing element 3" are suitable in principle for use with closing elements 3" of appropriate thickness. The contact pairings in FIGS. 8D to 8H are similar to the contact pairing used with the closing element 3' of FIGS. 6 and 7. Moreover, they are also especially suitable for thin closing elements 3". FIGS. 8C and 8F show special cases of the contact pairing with a single contact site in each case.

It is self-evident in all cases that through suitable adaptation of the curvatures of the contact faces a substantially line shaped contact site can be provided in place of a substantially point shaped contact site. Likewise, a contact site which is area shaped from the outset may also be provided. The contact sites of different types may also be combined with one another in any way within a pairing of contact faces.

The present invention has been described above with reference to examples having three holding elements in each case. It is, however, self-evident that, in other variants of the present invention, a different number of holding elements may also be provided. In particular, more than three holding elements holding the closing element may also be provided.

Furthermore, the present invention has been described above with reference to examples having plane-parallel closing elements in each case. It is, however, self-evident that, in other variants of the present invention, a different geometry may be provided for the closing element.

With the present invention a simple mounting of the closing element with low stress is possible. Tight deformation tolerances of the closing element within the range of a few nanometres can be maintained. The tilt of the first axis of the closing element relative to the geometrical axis of the holding device, and the centring of the closing element, can be adjusted with high accuracy. The adjustments do not vary throughout operation. In particular with adaptation of the coefficients of thermal expansion, sliding movements between the components, and therefore so-called hysteresis effects in which such sliding movements are not completely reversed, do not occur.

A further advantage lies in the avoidance of connections formed by materials, such as adhesive bonding or the like, through the use of purely frictional and positive-fit connections. This makes possible, firstly, simple assembly, disassembly, adjustment and readjustment. Secondly, the use of materials prone to contamination, such as plastics or the like, is avoided. The closing module according to the invention is therefore suitable for use with almost any wavelength.

A further advantage lies in the simple manufacture of the components of the closing module according to the invention. All the components can be produced by simple manufacturing methods, such as turning, milling, erosion, etc.

The invention claimed is:

1. A closing module for an optical arrangement, comprising:
   an optically active closing element having a first axis; and
   a holding device that clamps said closing element radially, and fixes said closing element at a point along said first axis,
   wherein said closing element and said holding device participate in preventing an ingress of matter into an interior portion of said optical arrangement, and
   wherein the holding device is configured for tilting of the first axis of the closing element, and includes a number of holding elements as second contact partners which each include a contact element being in respective engagement with the closing element as the first contact partner in a contact pairing, at least the contact element of an adjustable holding element being adjustable in a direction of the first axis of the closing element for tilting of the first axis of the closing element.

2. The closing module according to claim 1, wherein the adjustable holding element includes a holding body on which the contact element is arranged, the holding body being configured in the manner of a flexible beam in such a way that the contact element is deflectable in the direction of the first axis of the closing element.

3. The closing module according to claim 2, wherein the holding body includes at least one flexible portion having a reduced cross-sectional area.

4. The closing module according to claim 1, wherein the holding device includes a positioning device for moving the contact element in the direction of the first axis of the closing element.

5. A closing module for an optical arrangement, comprising:
   an optically active closing element having a first axis; and
   a holding device that clamps said closing element radially, and fixes said closing element at a point along said first axis,
   wherein said closing element and said holding device participate in preventing an ingress of matter into an interior portion of said optical arrangement, and
   wherein the holding device includes an inner frame and a number of holding elements connected to the inner frame.

6. The closing module according to claim 5, wherein at least one second holding element is configured in the manner of a fixed mount and is arranged on the inner frame, the second holding element being configured to be substantially rigid in a direction of the clamping force exerted thereby and being supported in the direction of the clamping force exerted thereby by means of at least one stop on the inner frame.

7. The closing module according to claim 5, wherein a gap is formed between the closing element and the inner frame.

8. A closing module for an optical arrangement, comprising:
   an optically active closing element having a first axis; and
   a holding device fixing the closing element at least in a direction of the first axis,
   wherein the holding device is configured to clamp the closing element radially,
   wherein the holding device includes an inner frame and a number of holding elements connected to the inner frame,
   wherein a gap is formed between the closing element and the inner frame, and wherein the holding device includes a purging device for guiding a purging stream of a purging medium through the gap.

9. The closing module according to claim 5, wherein the holding device comprises an outer flange for connection of the holding device to an adjacent component, and a first wall,
the outer flange being spaced radially from the inner frame and
the first wall extending in a circumferential direction of the inner frame and extending between the inner first frame and the outer flange.

10. The closing module according to claim 9, wherein the outer flange includes a number of connection areas for connection of the holding device to an adjacent component, a slot penetrating in a direction of the first axis being provided, in the circumferential direction, before and after the respective connection area for decoupling of deformations, said slot extending through the outer flange and radially into the wall.

11. A lens barrel having a closing module for an optical arrangement, wherein said closing module comprises:
an optically active closing element having a first axis; and
a holding device fixing the closing element at least in a direction of the first axis,
wherein the holding device is configured to clamp the closing element radially, and
wherein a gap is formed between the closing element and the holding device and a purging device for directing a purging stream of a purging medium through the gap is provided.

12. A closing module for an optical arrangement, comprising:
an optically active closing element having a first axis; and
a holding device that tilts said closing element to orient said first axis, and fixes said closing element at a point along said first axis,
wherein said closing element and said holding device participate in preventing an ingress of matter into an interior portion of said optical arrangement, and
wherein the holding device includes a number of holding elements as second contact partners, each of which includes a contact element that is in engagement with the closing element as the first contact partner in a contact pairing, at least the contact element of an adjustable holding element being adjustable in a direction of the first axis of the closing element for tilting of the first axis of the closing element.

13. The closing module according to claim 12, wherein the adjustable holding element includes a holding body on which the contact element is arranged, the holding body being configured in the manner of a flexible beam in such a way that the contact element is deflectable in the direction of the first axis of the closing element.

14. The closing module according to claim 13, wherein the holding body includes at least one flexible portion having a reduced cross-sectional area.

15. The closing module according to claim 12, wherein the holding device includes a positioning device for moving the contact element in the direction of the first axis of the closing element.

16. A closing module for an optical arrangement, comprising:
an optically active closing element having a first axis; and
a holding device that tilts said closing element to orient said first axis, and fixes said closing element at a point along said first axis,
wherein said closing element and said holding device participate in preventing an ingress of matter into an interior portion of said optical arrangement, and
wherein the holding device is configured for radial clamping of the closing element.

17. A closing module for an optical arrangement, comprising:
an optically active closing element having a first axis; and
a holding device that tilts said closing element to orient said first axis, and fixes said closing element at a point along said first axis,
wherein said closing element and said holding device participate in preventing an ingress of matter into an interior portion of said optical arrangement, and
wherein the holding device is configured to hold the closing element by exerting onto the closing element clamping forces which are disposed in a plane substantially perpendicular to the first axis, respectively.

18. A closing module for an optical arrangement, comprising:
an optically active closing element having a first axis; and
a holding device that tilts said closing element to orient said first axis, and fixes said closing element at a point along said first axis,
wherein said closing element and said holding device participate in preventing an ingress of matter into an interior portion of said optical arrangement, and
wherein the holding device includes a number of holding elements as second contact partners in respective engagement with the closing element as the first contact partner in a contact pairing, and exerting onto said closing element a clamping force directed substantially towards the first axis, respectively.

19. The closing module according to claim 18, wherein the contact pairing between the closing element and the holding device is configured such that the clamping force exerted by the holding element acts substantially in the neutral fibre of the closing element.

20. The closing module according to claim 18, wherein at least one first holding element, to generate the clamping force, is configured in the manner of a resilient mount.

21. The closing module according to claim 20, wherein the first holding element includes a contact element provided to cooperate with the closing element, and a holding body, the contact element being arranged on the holding body to be resilient in the direction of the clamping force to be exerted onto the closing element.

22. A closing module for an optical arrangement, comprising:
an optically active closing element having a first axis; and
a holding device that tilts said closing element to orient said first axis, and fixes said closing element at a point along said first axis,
wherein said closing element and said holding device participate in preventing an ingress of matter into an interior portion of said optical arrangement,
wherein the holding device includes an inner frame and a number of holding elements connected to the inner frame, and
wherein at least one second holding element is configured in the manner of a fixed mount and is arranged on the inner frame, the second holding element being configured to be substantially rigid in a direction of the clamping force exerted thereby and being supported in the direction of the clamping force exerted thereby by means of at least one stop on the inner frame.

23. A closing module for an optical arrangement, comprising:

an optically active closing element having a first axis; and a holding device that tilts said closing element to orient said first axis, and fixes said closing element at a point along said first axis, wherein said closing element and said holding device participate in preventing an ingress of matter into an interior portion of said optical arrangement, and wherein the holding device includes an outer flange for connection of the holding device to an adjacent component, and a first wall, the outer flange being spaced radially from the inner frame, and the first wall being extending in a circumferential direction of the inner frame, and extending between the inner first frame and the outer flange.

24. The closing module according to claim 23, wherein the outer flange includes a number of connection areas for connection of the holding device to an adjacent component, a slot penetrating in a direction of the first axis being provided, in the circumferential direction, before and after the respective connection area for decoupling of deformations, said slot extending through the outer flange and radially into the wall.

25. A lens barrel having a closing module for an optical arrangement, wherein said closing module comprises:

an optically active closing element having a first axis; and a holding device that tilts said closing element to orient said first axis, and fixes said closing element at a point along said first axis, wherein said closing element and said holding device participate in preventing an ingress of matter into an interior portion of said optical arrangement, and wherein a gap is formed between the closing element and the holding device and a purging device for directing a purging stream of a purging medium through the gap is provided.

* * * * *